(12) United States Patent
Kang

(10) Patent No.: US 8,129,200 B2
(45) Date of Patent: Mar. 6, 2012

(54) NONVOLATILE FERROELECTRIC MEMORY DEVICE AND METHOD FOR MANUFACTURING THE SAME

(75) Inventor: Hee Bok Kang, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/905,706

(22) Filed: Oct. 15, 2010

(65) Prior Publication Data
US 2011/0033955 A1    Feb. 10, 2011

Related U.S. Application Data

(62) Division of application No. 11/525,136, filed on Sep. 22, 2006, now Pat. No. 7,842,990.

(30) Foreign Application Priority Data

Feb. 17, 2006  (KR) .................. 10-2005-0015662
Feb. 17, 2006  (KR) .................. 10-2006-0015659

(51) Int. Cl.
*H01L 21/00* (2006.01)
*H01L 21/8234* (2006.01)
*H01L 21/8242* (2006.01)
*H01L 21/20* (2006.01)

(52) U.S. Cl. ............ 438/3; 438/238; 438/239; 438/243; 438/386; 438/622; 257/E21.008; 257/E21.009; 257/E21.663; 257/E21.664

(58) Field of Classification Search ........... 257/E21.008, 257/E21.009, E21.272, E21.663, E21.664
See application file for complete search history.

(56) References Cited

U.S. PATENT DOCUMENTS

| | | | |
|---|---|---|---|
| 6,043,526 A * | 3/2000 | Ochiai .......................... | 257/295 |
| 7,420,237 B2 * | 9/2008 | Nagano et al. ................ | 257/295 |
| 7,825,420 B2 * | 11/2010 | Gaidis et al. .................. | 257/95 |
| 2004/0021226 A1 * | 2/2004 | Geffken et al. ................ | 257/758 |
| 2006/0033134 A1 * | 2/2006 | Lee ................................. | 257/295 |
| 2006/0108621 A1 * | 5/2006 | Hayashi et al. ................ | 257/295 |

* cited by examiner

*Primary Examiner* — Mohsen Ahmadi
(74) *Attorney, Agent, or Firm* — IP & T Group LLP

(57) ABSTRACT

A nonvolatile ferroelectric memory device includes a plurality of unit cells. Each of the unit cells includes a cell capacitor and a cell transistor. The cell capacitor includes a storage node, a ferroelectric layer, and a plate line. The cell capacitors of more than one of the plurality of unit cells are provided in a trench.

8 Claims, 11 Drawing Sheets

NONVOLATILE FERROELECTRIC MEMORY DEVICE AND METHOD FOR MANUFACTURING THE SAME

RELATED APPLICATIONS

This application is a division of U.S. patent application Ser. No. 11/525,136 filed on Sep. 22, 2006 now U.S. Pat. No. 7,842,990, which claims priority of Korean patent application number 10-2006-0015659 and Korean Application No. 10-2005-0015662, both filed on Feb. 17, 2006. The disclosure of each of the foregoing applications is incorporated herein by reference in its entirety.

BACKGROUND OF THE INVENTION

1. Field of the Invention

The present invention generally relates to a nonvolatile ferroelectric memory device and a method for manufacturing the same, and more specifically, to a device and a method of improving a structure of a nonvolatile ferroelectric capacitor to minimize an area of a trench capacitor.

2. Description of the Related Art

Generally, a ferroelectric random access memory (hereinafter, referred to as 'FeRAM') has attracted considerable attention as a next generation memory device because it has a data processing speed as fast as a Dynamic Random Access Memory (hereinafter, referred to as 'DRAM') and preserves data even after the power is turned off.

A FeRAM having a structure similar to a DRAM includes capacitors made of a ferroelectric substance, so that it utilizes the high residual polarization characteristic of the ferroelectric substance in which data is not deleted even after an electric field is eliminated.

A unit cell of a conventional nonvolatile FeRAM device includes a switching element and a nonvolatile ferroelectric capacitor. The switching element performs a switching operation depending on a state of a word line to connect a nonvolatile ferroelectric capacitor to a bit line or disconnect the nonvolatile ferroelectric capacitor from the bit line. The nonvolatile ferroelectric capacitor is connected between a plate line and a terminal of the switching element. Here, the switching element of the conventional FeRAM is an NMOS transistor whose switching operation is controlled by a gate control signal.

Recently, nonvolatile ferroelectric capacitors having three-dimensional structures have been formed with an MOCVD (Metal Organic Chemical Vapor Deposition) process to increase a capacity of memory cell arrays.

Also, the nonvolatile ferroelectric capacitor having a three-dimensional structure may be formed as a three-dimensional trench capacitor structure using a trench etch structure.

FIG. 1 is a circuit diagram illustrating a cell array block of a conventional nonvolatile ferroelectric memory device.

The cell array block of the conventional nonvolatile ferroelectric memory device includes a top cell array block TCA and a bottom cell array block BCA arranged symmetrically on the sides of a sense amplifier S/A.

Each of the top cell array block TCA and the bottom cell array block BCA includes a plurality of unit cells UC.

Each of the unit cells UC includes a nonvolatile ferroelectric capacitor and a cell transistor T. Nonvolatile ferroelectric capacitor FC is connected between a plate line PL and one terminal of the cell transistor T. Cell transistor T is configured to perform a switching operation in response to a signal on a word line, such as word lines WL0 and WL1, to connect nonvolatile ferroelectric capacitor FC to a bit line BL or /BL or disconnect ferroelectric capacitor FC from bit line BL or /BL.

The cell transistor T has a drain connected to the bit line BL, and a source connected to an electrode, referred to as storage node SN, of the nonvolatile ferroelectric capacitor FC.

The other terminal of the nonvolatile ferroelectric capacitor FC is connected to the plate terminal PL to receive a plate voltage.

The sense amplifier S/A is connected to bit lines BL and /BL.

When the selected word line WL0 of the top cell array block TCA is activated and cell data are transmitted into the bit line BL, the bit line /BL supplies a reference voltage.

On the other hand, when the selected word line WL0 of the bottom cell array block BCA is activated and cell data are transmitted into the bit line /BL, the bit line BL supplies a reference voltage.

The sense amplifier SA senses and amplifies data on the bit lines BL or /BL, and transmits the amplified data into global bit lines GBL and GELB, or transmits data on the global bit lines GBL and GELB onto the bit lines BL or /BL.

FIG. 2a is a plan view of cell array block of a conventional nonvolatile ferroelectric memory device.

Referring to FIG. 2a, a plurality of nonvolatile ferroelectric capacitors FC are arranged in rows and columns. Each nonvolatile ferroelectric capacitor FC includes a rectangular storage node SN, a ferroelectric layer FL inside the storage node SN, and a plate line PL inside the ferroelectric layer FL.

FIG. 2b is a cross-sectional diagram view along A-A' in FIG. 2a.

Referring to FIG. 2b, cell transistors T are provided below the nonvolatile ferroelectric capacitors FC.

Each cell transistor T includes a drain 2 and a source 4 in a substrate 1, an insulating layer 6, and a gate electrode as the corresponding word line WL sequentially formed over a channel region defined between the drain 2 and the source 4. The drain 2 is connected to the bit line BL, and the source 4 is connected to the nonvolatile ferroelectric capacitor FC through a contact node CN. One trench capacitor FC is formed over one contact node CN.

The nonvolatile ferroelectric capacitor FC includes the storage node SN, the ferroelectric layer FL, and the plate line FL which are sequentially formed. Here, the storage node SN of the nonvolatile ferroelectric capacitor FC is formed to have a 'U' shape.

The minimum layout area of the conventional three-dimensional trench capacitor is twice as large as the thickness of the cell node SN and the ferroelectric layer FL and the plate line PL.

The conventional trench capacitor includes a trench in one cell transistor T.

The general cell size is determined depending on the size of the trench. As a result, when the size of the trench is increased or the number of trenches are increased, the area of the capacitor becomes larger so that the size of chip upon which the memory array is provided is also increased.

SUMMARY OF THE INVENTION

Various embodiments of the present invention are directed at minimizing an area of a nonvolatile ferroelectric capacitor.

Consistent with the present invention, a nonvolatile ferroelectric memory device includes a plurality of unit cells. Each of the unit cells includes a cell capacitor and a cell transistor. The cell capacitor includes a storage node, a ferroelectric layer, and a plate line. The cell capacitors of more than one of the plurality of unit cells are provided in a trench.

Consistent with the present invention, a method for manufacturing a nonvolatile ferroelectric memory device having a cell array block including a plurality of unit cells includes forming cell transistors on a semiconductor substrate; forming contact nodes for connecting cell capacitors to the cell transistors; forming a first insulating film over the cell transistors and the contact nodes; selectively etching the first insulating film to form trenches; forming storage nodes connected to the contact nodes, wherein the storage nodes are separated from each other and a predetermined number of the storage nodes are formed in one of the trenches; forming a ferroelectric layer over the storage nodes; and forming a plate line over the ferroelectric layer.

BRIEF DESCRIPTION OF THE DRAWINGS

Other aspects and advantages of the present invention will become apparent upon reading the following detailed description and upon reference to the drawings in which:

FIG. 2b is a cross-sectional view taken along line A-A' of FIG. 2a;

FIG. 3b is a cross-sectional view taken along line B-B' of FIG. 3a;

FIG. 5b is a cross-sectional view taken along line C-C' of FIG. 5a;

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like part.

A cell array block of a nonvolatile ferroelectric memory device consistent with the present invention includes a top cell array block and a bottom cell array block arranged symmetrically on the sides of a sense amplifier. Each of the top cell array block and the bottom cell array block includes a plurality of unit cells.

Each of the unit cells includes a nonvolatile ferroelectric capacitor and a cell transistor. The nonvolatile ferroelectric capacitor is connected between a plate line and one terminal of the cell transistor, and the cell transistor is configured to perform a switching operation in response to a signal on a word line to connect the nonvolatile ferroelectric capacitor to a bit line or disconnect the nonvolatile ferroelectric capacitor from the bit line.

The cell transistor has a drain connected to the bit line, and a source connected to an electrode, referred to as a storage node, of the nonvolatile ferroelectric capacitor.

The other terminal, referred to as a plate terminal, of the nonvolatile ferroelectric capacitor is coupled to receive a plate voltage.

The sense amplifier is connected to a pair of bit lines, one in the top cell array block and the other in the bottom cell array block.

When a selected word line in the top cell array block is activated and cell data are transmitted onto the one bit line in the top cell array block to one input of the sense amplifier, the bit line in the bottom cell array block supplies a reference voltage to the other input of the sense amplifier.

Conversely, when a selected word line in the bottom cell array block is activated and cell data are transmitted onto the bit line in the bottom cell array block to one input of the sense amplifier, the bit line in the top cell array block supplies a reference voltage to the other input of the sense amplifier.

The sense amplifier senses and amplifies data in the pair of bit lines and transmits the amplified data onto global bit lines. The sense amplifier also transmits data from the global bit lines onto the bit lines.

Figure 1:
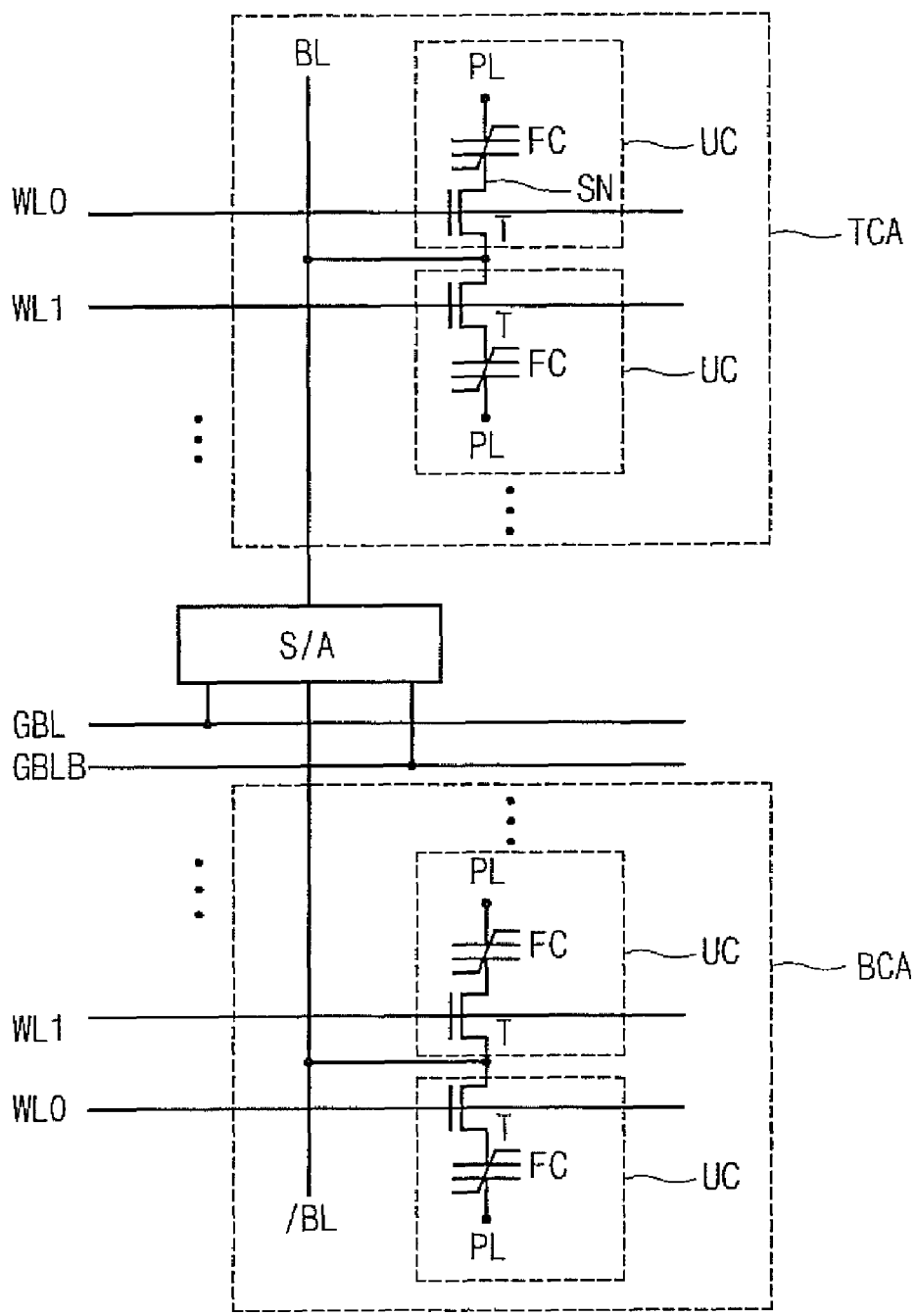
FIG. 1 is a cross-sectional view illustrating a cell array block of a conventional nonvolatile ferroelectric memory device.
Figure 2A:
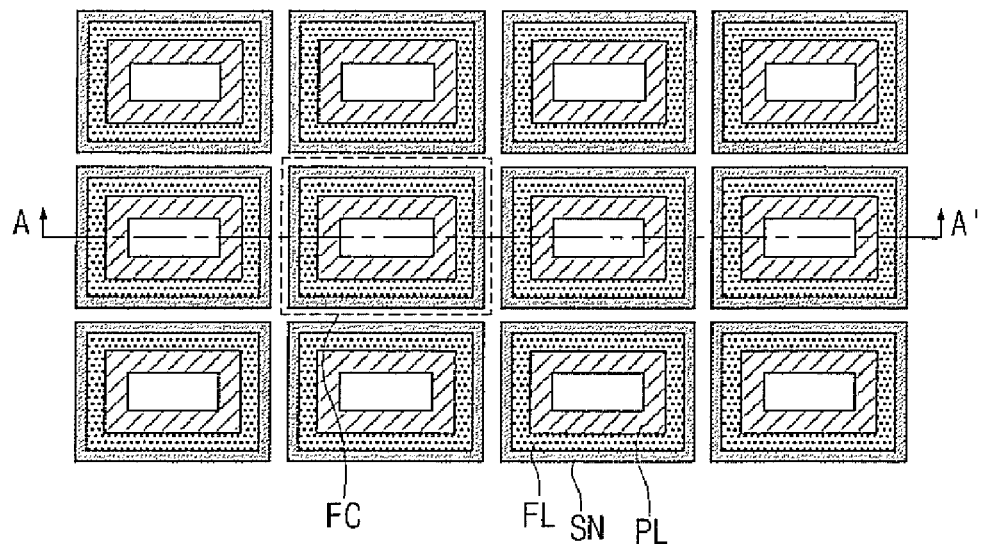
FIG. 2a is a plan view illustrating a cell array block of a conventional nonvolatile ferroelectric memory device.
Figure 2B:
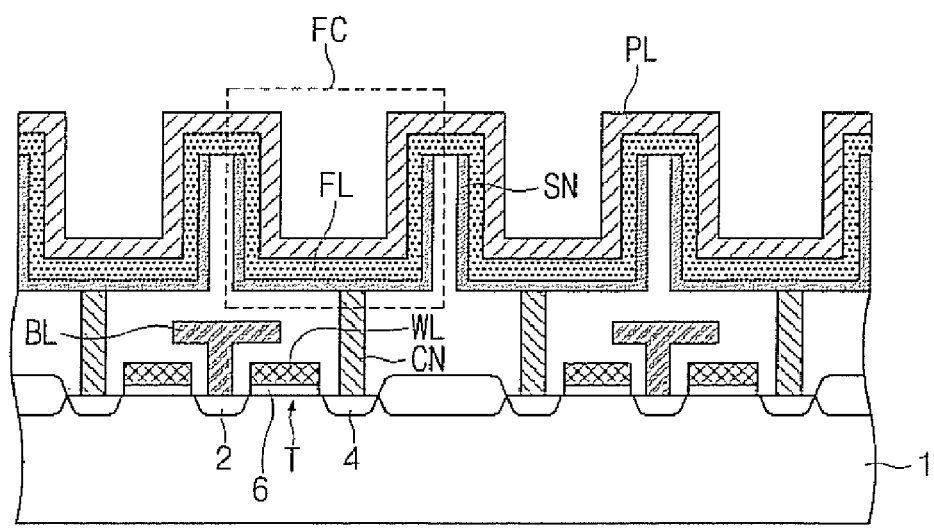
Figure 3A:
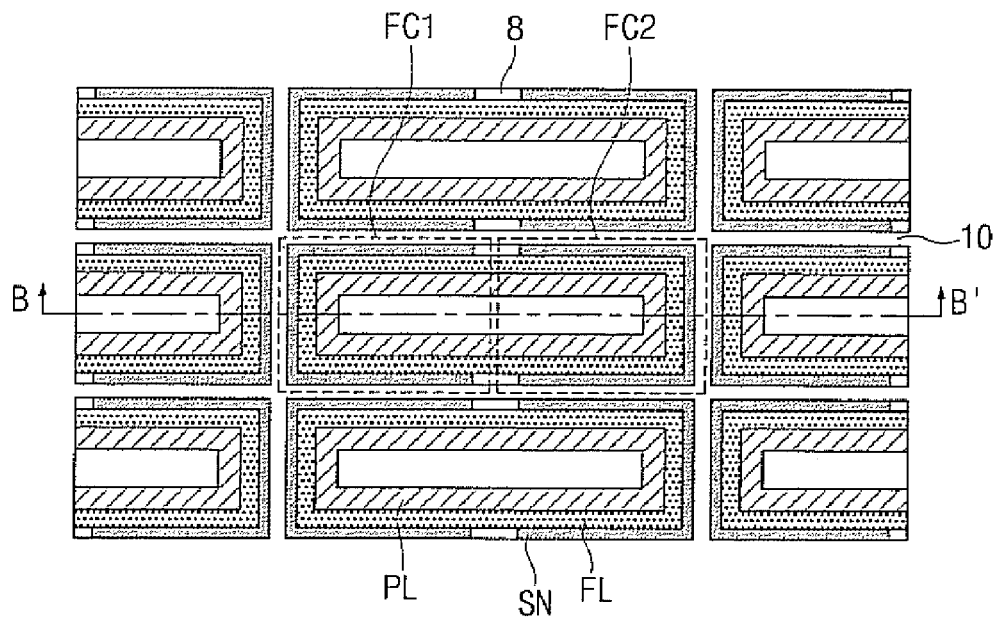
FIG. 3a is a plan view illustrating a cell array block of a nonvolatile ferroelectric memory device consistent with the present invention.

FIG. 3a is a plan view of a cell array block of a nonvolatile ferroelectric memory device consistent with the present invention. The cell array block includes a plurality of pairs of nonvolatile ferroelectric capacitors arranged in rows and columns, wherein each pair of nonvolatile ferroelectric capacitors is formed in a trench in an insulating film 10. Two such nonvolatile ferroelectric capacitors are designated as FC1 and FC2 in FIG. 3a.

Each of nonvolatile ferroelectric capacitors FC1 and FC2 includes a '['-shaped storage node SN, a ferroelectric layer FL smaller than and inside the storage node SN, and a plate line PL smaller than and inside the ferroelectric layer FL. Consistent with the present invention, the storage nodes SN of the nonvolatile ferroelectric capacitors FC1 and FC2 each have a '[' or ']' shape and are separated by an insulating film 8. However, the storage nodes SN of the nonvolatile ferroelectric capacitors FC1 and FC2 are separated from the storage nodes SN of other nonvolatile ferroelectric capacitors by the insulating film 10. In other words, in each trench of the insulating film 10, there are formed two of the nonvolatile ferroelectric capacitors.

Figure 3B:
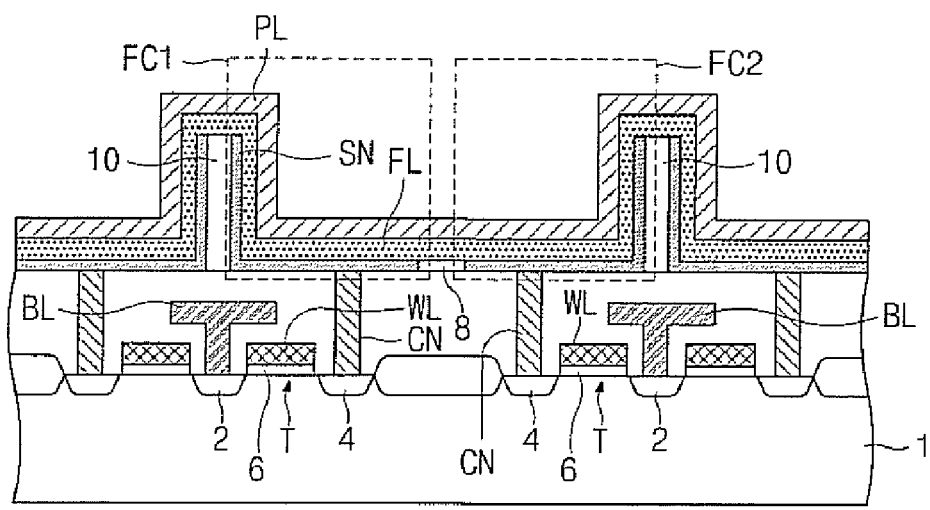

FIG. 3b is a cross-sectional view taken along line B-B' direction in FIG. 3a.

Referring to FIG. 3b, a cell transistor T is formed below each of the nonvolatile ferroelectric capacitors FC. The cell transistor T includes a drain 2 and a source 4 in a substrate 1, an insulating layer 6, a word line WL sequentially formed over a channel region defined between the drain 2 and the source 4. The drain 2 is connected to a bit line BL, and the source 4 is connected to the corresponding nonvolatile ferroelectric capacitor through a contact node CN.

Each of the nonvolatile ferroelectric capacitors, e.g., FC1 and FC2, includes the storage node SN as a bottom electrode, the ferroelectric layer FL as a dielectric layer, and the plate line PL as a top electrode sequentially formed over the corresponding cell transistor T. Consistent with the present invention, the storage node SN of each of the nonvolatile ferroelectric capacitors has an 'L' shape and is isolated from the storage nodes SN of adjacent nonvolatile ferroelectric capacitors by the insulating films 8 and 10. As shown in FIGS. 3a and 3b, two of the nonvolatile ferroelectric capacitors are formed between in each trench in the insulating film 10 and are separated from each other by the insulating film 8.

FIGS. 4a through 4f are cross-sectional views illustrating a method for manufacturing the nonvolatile ferroelectric memory device as shown in FIGS. 3a and 3b.

Figure 4A:
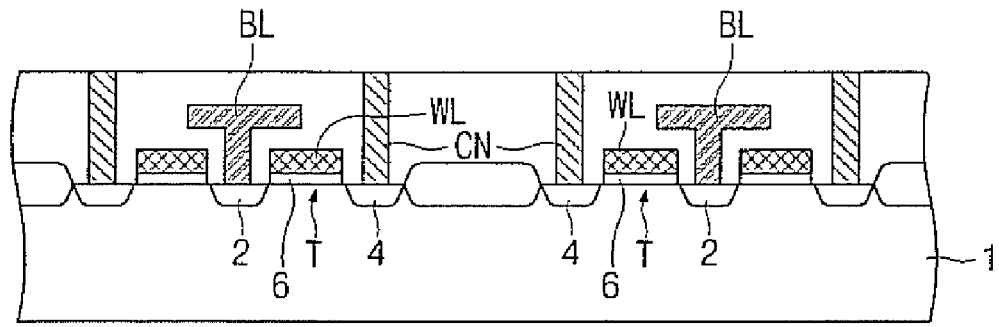
FIGS. 4a through 4f are cross-sectional views illustrating a method for manufacturing a nonvolatile ferroelectric memory device consistent with the present invention.

Referring to FIG. 4a, the drain 2 and the source 4 are formed in the substrate 1, and the insulating layer 6 and the word line WL are sequentially formed over the channel region defined between the drain 2 and the source 4, thereby forming the cell transistor T.

The drain 2 is connected to the bit line BL, and a contact node CN for connecting the corresponding nonvolatile ferroelectric capacitor is formed over the source 4. Here, the contact node CN is formed by a plug process.

Figure 4B:
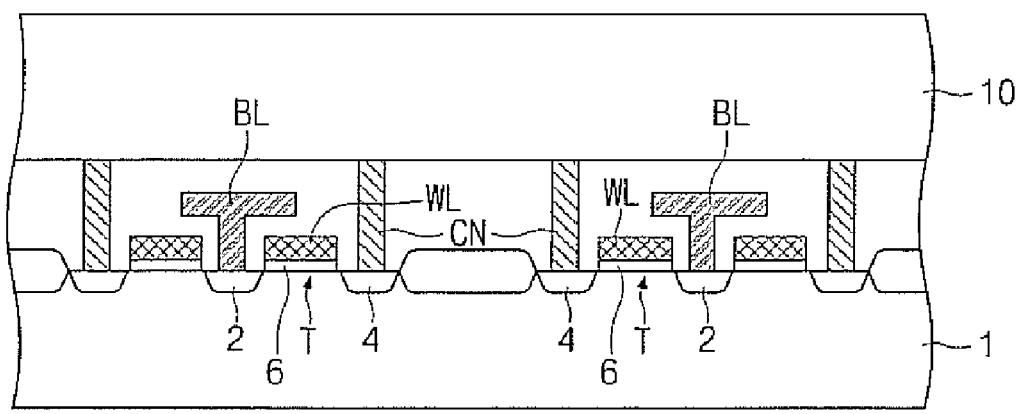

Referring to FIG. 4b, the insulating film 10 is formed over the entire surface of the cell transistor T of FIG. 4a.

Figure 4C:
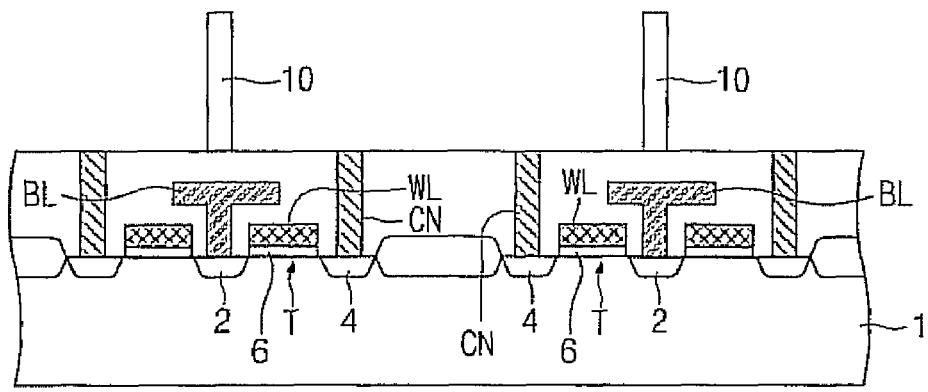

Referring to FIG. 4c, the insulating film 10 is patterned through a photoetching process to form trenches having a predetermined depth.

Figure 4D:
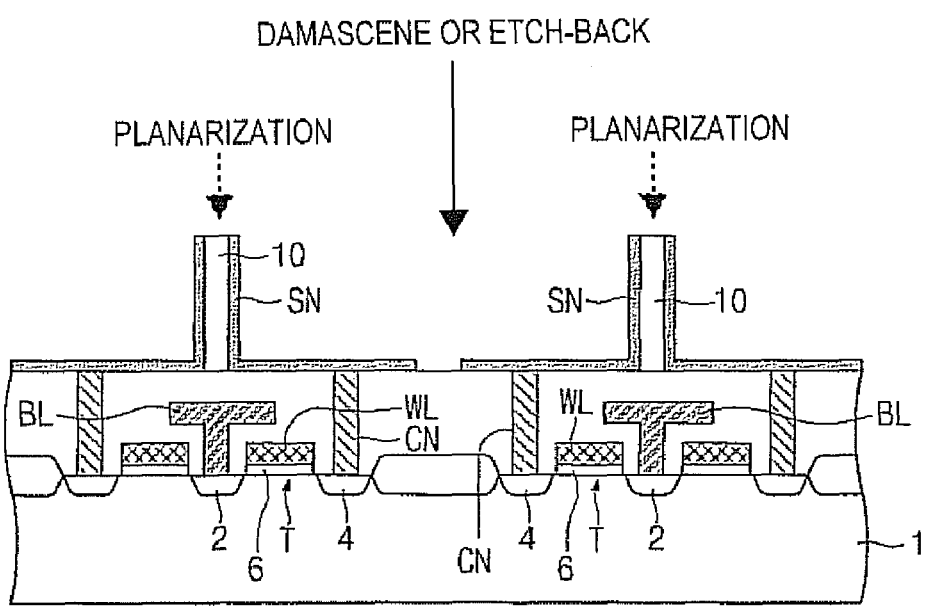

Referring to FIG. 4d, a conductive material is deposited over the entire surface of the resulting structure of FIG. 4c, and is patterned, by a damascene process or an etch-back process, to form the storage nodes SN of the nonvolatile ferroelectric capacitors separated from each other. Also, a planarization process is performed to expose the top surface of the insulating film 10. Each storage node SN is formed to have an "L" shape in a cross-sectional view and is connected to a corresponding contact node CN.

Figure 4E:
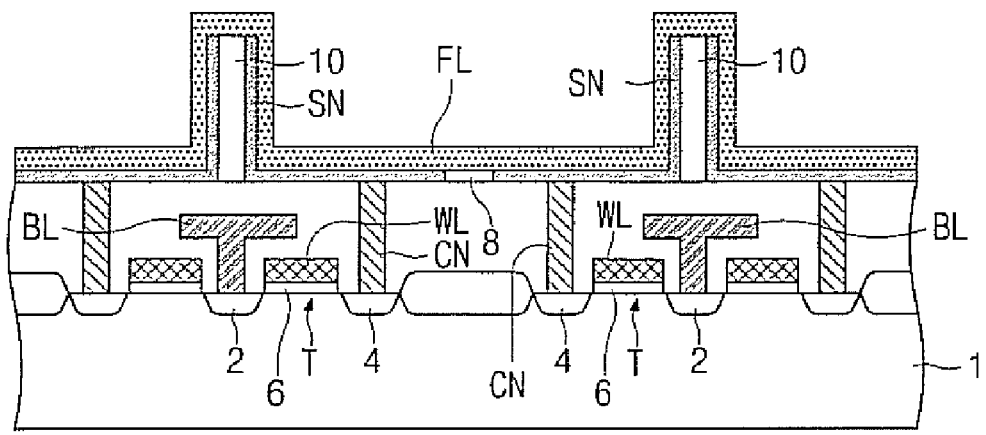

Referring to FIG. 4e, a ferroelectric material is deposited to a predetermined thickness over the entire surface of the resulting structure of FIG. 4d to the ferroelectric layer FL which is a dielectric film of the nonvolatile ferroelectric capacitor FC. When the gaps between the storage nodes SN are small, the ferroelectric material is simultaneously filled in the gaps between the storage nodes SN to form the insulating film 8.

Figure 4F:
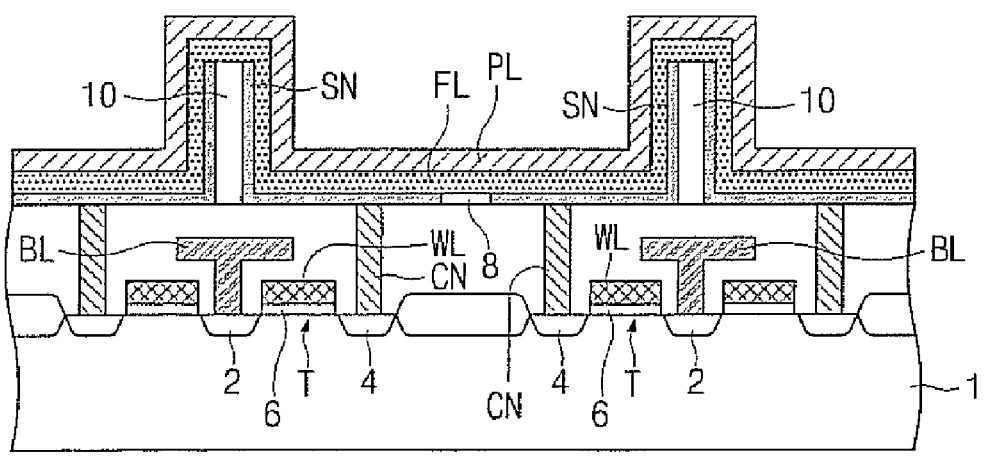

Referring to FIG. 4f, a conductive material is deposited over the entire surface of the resulting structure of FIG. 4e through CVD (Chemical Vapor Deposition) or ALD (Atomic Layer Deposition), and etched through a chemical mechanical polishing process or an etch-back process, to form the plate line PL which is a top electrode of the nonvolatile ferroelectric capacitor FC. In one aspect of the invention, the plate lines PL are connected in common in a row direction.

Because inside each trench in the insulating film 10 are formed two of the nonvolatile ferroelectric capacitors, the area of each trench capacitor occupied on the surface of the substrate 1 is reduced to half of that of a conventional trench capacitor.

Figure 5A:
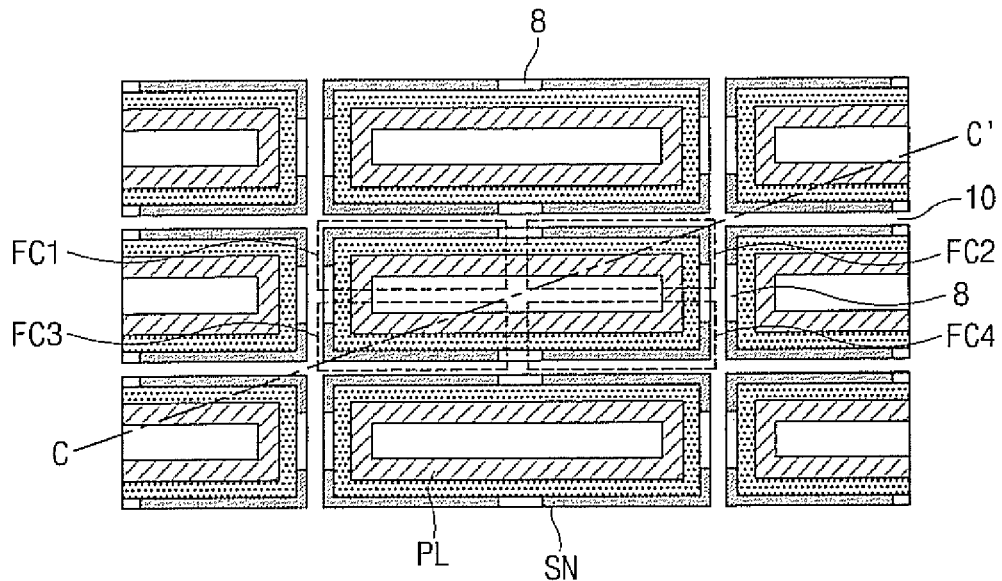
FIG. 5a is a plan view illustrating a cell array block of a nonvolatile ferroelectric memory device consistent with the present invention.

FIG. 5a is a plan view illustrating a cell array block of a nonvolatile ferroelectric memory device consistent with the present invention. The cell array block includes a plurality of sets of four nonvolatile ferroelectric capacitors arranged in rows and columns, wherein each set of four nonvolatile ferroelectric capacitors is separated from other sets by an insulating film 10 to have a predetermined interval. For example, a set of four nonvolatile ferroelectric capacitors in FIG. 5a includes nonvolatile ferroelectric capacitors FC1, FC2, FC3 and FC4 formed within one trench in an insulating film 10. As FIG. 5a shows, each of the nonvolatile ferroelectric capacitors includes a 'L'-shaped storage node SN, a ferroelectric layer FL inside the storage node SN, and a plate line PL inside the ferroelectric layer FL. The storage nodes SN of the four nonvolatile ferroelectric capacitors within one trench of the insulating film 10 have an 'L' shape and are separated from one another by an insulating film 8.

Figure 5B:
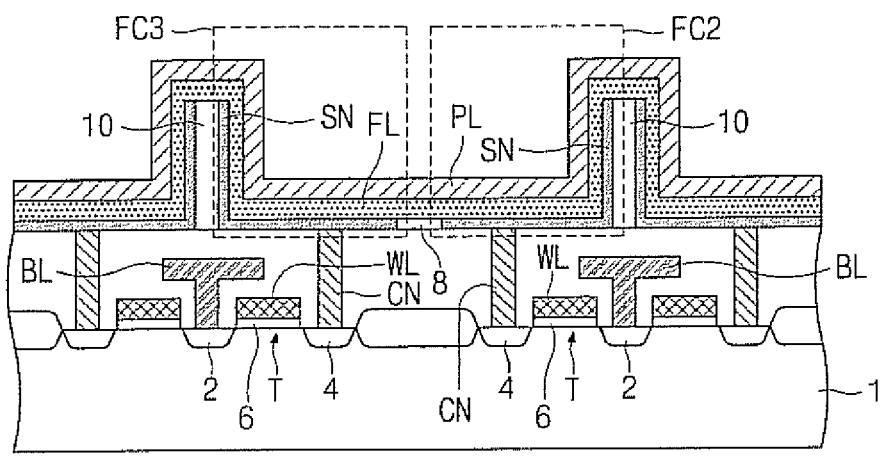

FIG. 5b is a cross-sectional view along line C-C' in FIG. 5a.

Referring to FIG. 5b, a cell transistor T is provided below the corresponding nonvolatile ferroelectric capacitor.

The cell transistor T includes a drain 2 and a source 4 formed in a substrate 1, and an insulating layer 6 and a word line WL are sequentially formed over a channel region defined between the drain 2 and the source 4. The drain 2 is connected to a bit line BL, and the source 4 is connected to the corresponding nonvolatile ferroelectric capacitor through a contact node CN.

Each of the nonvolatile ferroelectric capacitors, e.g., FC1, FC2, FC3 and FC4, includes the storage node SN as the bottom electrode, the ferroelectric layer FL as the dielectric layer, and the plate line FL as the top electrode, sequentially formed over the corresponding cell transistor T. As shown in FIGS. 5a and 5b, four of the nonvolatile ferroelectric capacitors, e.g., FC1, FC2, FC3 and FC4, are formed in each trench in the insulating film 10 and are separated from one another by the insulating films 8.

FIGS. 6a through 6f are cross-sectional views illustrating a method for manufacturing the nonvolatile ferroelectric memory device consistent with the present invention, as shown in FIGS. 5a and 5b.

Figure 6A:
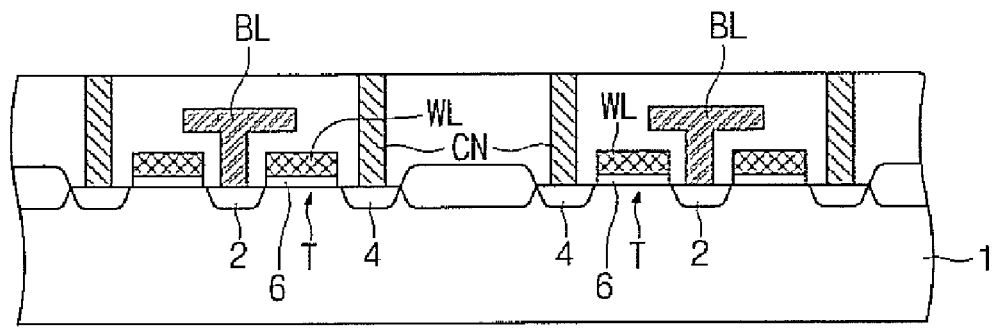
FIGS. 6a through 6f are cross-sectional diagrams illustrating a method for manufacturing a nonvolatile ferroelectric memory device consistent with the present invention.

Referring to FIG. 6a, the drain 2 and the source 4 are formed in the substrate 1, and the insulating layer 6 and the word line WL are sequentially formed over the channel region defined between the drain 2 and the source 4, thereby forming the cell transistor T.

The drain 2 is connected to the bit line BL, and a contact node CN for connecting to the corresponding nonvolatile ferroelectric capacitor is formed over the source 4. Here, the contact node CN is formed by a plug process.

Figure 6B:
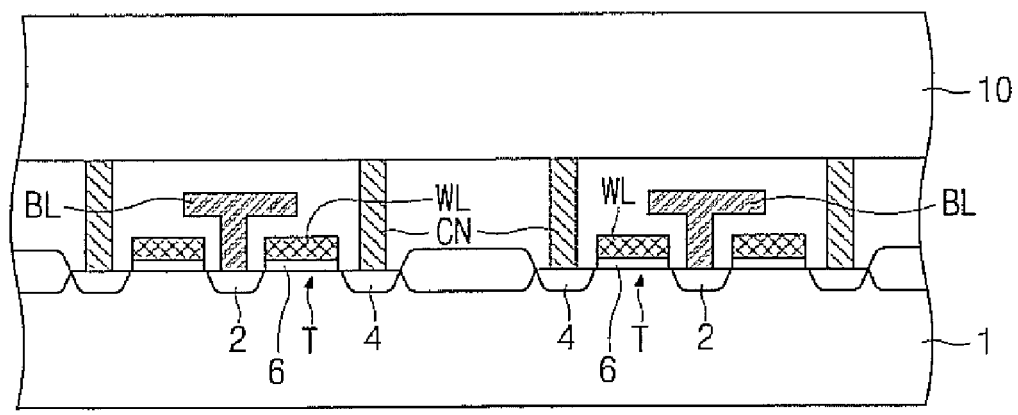

Referring to FIG. 6b, the insulating film 10 is formed over the entire surface of the cell transistor T of FIG. 6a.

Figure 6C:
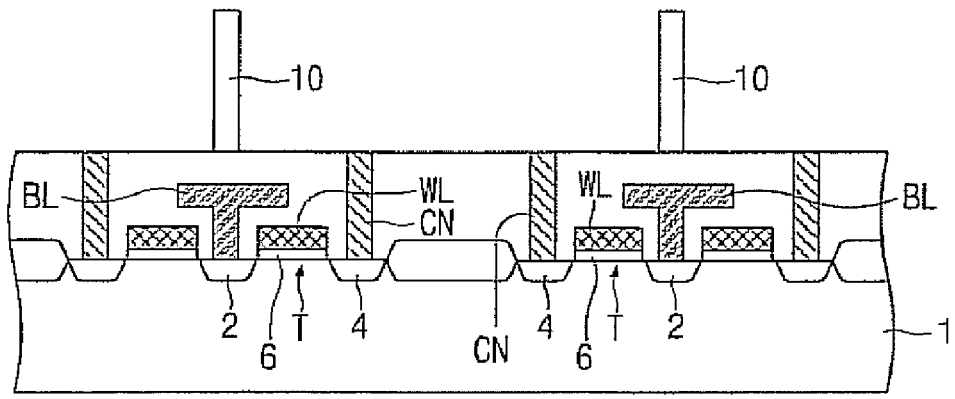

Referring to FIG. 6c, the insulating film 10 is patterned through a photoetching process to form trenches having a predetermined depth.

Figure 6D:
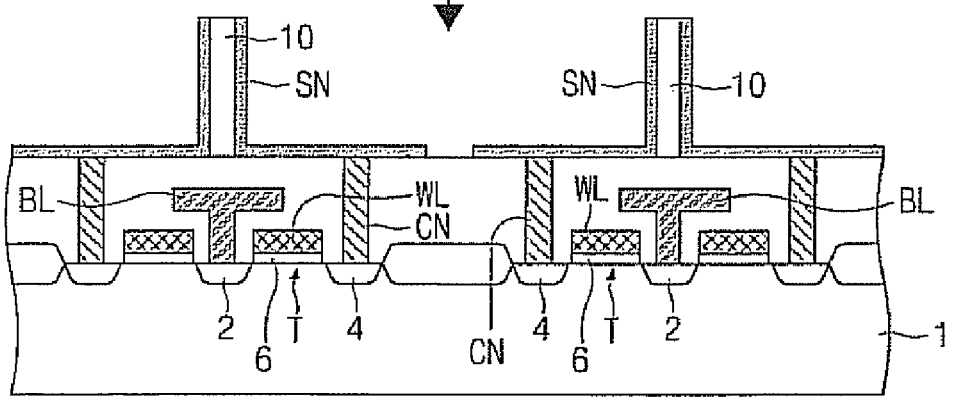

Referring to FIG. 6d, a conductive material is deposited over the entire surface of the resulting structure of FIG. 4c and separated from each other by a damascene process or an etch-back process, thereby forming the storage nodes SN of the nonvolatile ferroelectric capacitors. Also, a planarization process is performed to expose the top surface of the insulating film 10.

Figure 6E:
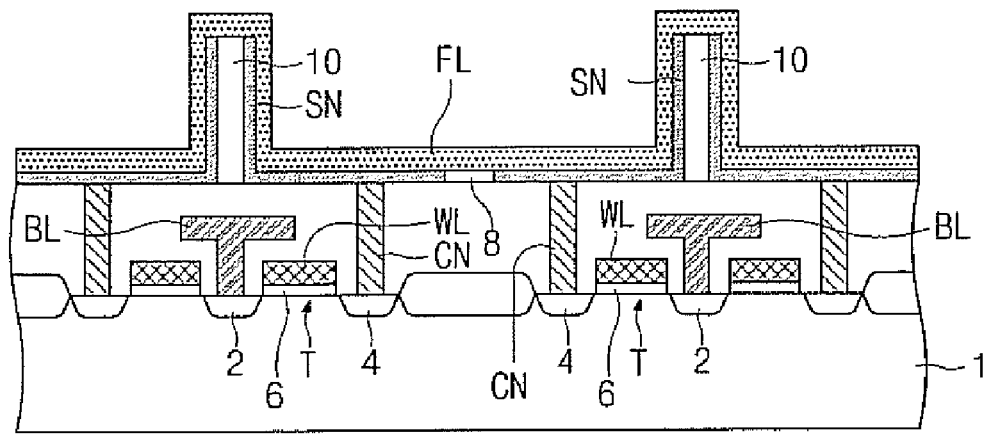

Referring to FIG. 6e, a ferroelectric material is deposited to a predetermined thickness over the entire surface of the resulting structure of FIG. 4d to form the ferroelectric layers FL of the nonvolatile ferroelectric capacitors. When the gaps between the storage nodes SN are small, the ferroelectric material is simultaneously filled in the gaps between the storage nodes SN to form the insulating film 8.

Figure 6F:
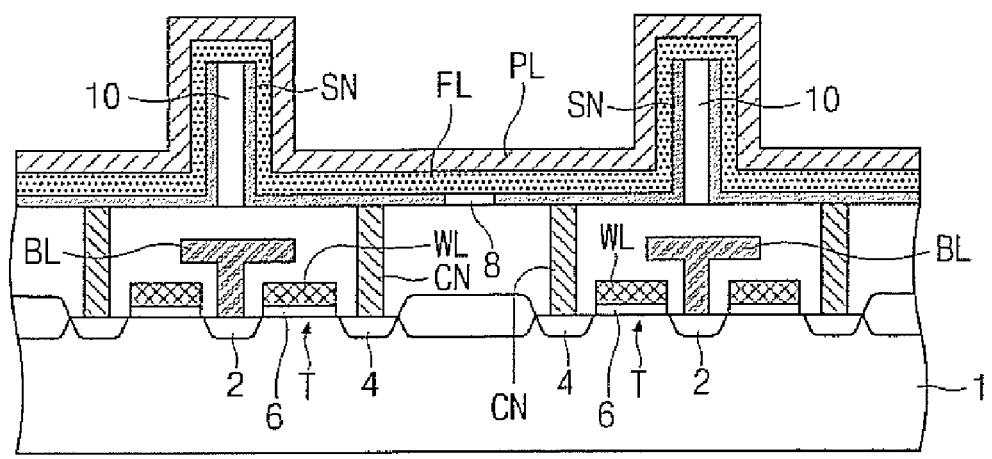

Referring to FIG. 6f, a conductive material is deposited over the entire surface of the resulting structure of FIG. 4e through CVD (Chemical Vapor Deposition) or ALD (Atomic Layer Deposition) and etched through a chemical mechanical polishing process or an etch-back process to form the plate lines PL of the nonvolatile ferroelectric capacitors. In one aspect of the invention, the plate lines PL are connected in common in a row direction.

Because the storage nodes SN of the nonvolatile ferroelectric capacitor formed to have an "L" shape in the cross-sectional structure, and four of the storage nodes SN may be formed within each trench in the insulating film 10, the area of each nonvolatile ferroelectric capacitor is reduced to ¼ of that of a conventional trench capacitor.

Figure 7:
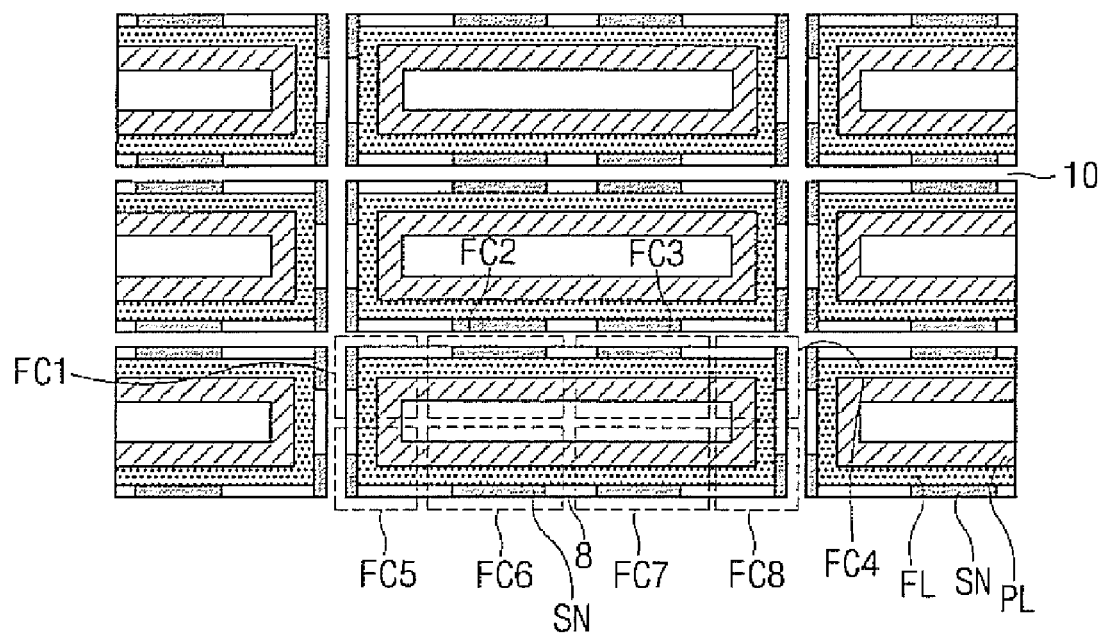
FIG. 7 is a plan view illustrating a cell array block of a nonvolatile ferroelectric memory device consistent with the present invention.

FIG. 7 is a plan view illustrating a cell array block of a nonvolatile ferroelectric memory device consistent with the present invention.

Referring to FIG. 7, the cell array block includes a plurality of sets of eight nonvolatile ferroelectric capacitors, e.g., FC1-FC8, arranged in rows and columns. Each set of eight nonvolatile ferroelectric capacitors are formed within a trench in an insulating film 10 and are separated from one another by an insulating film 8. Each of the nonvolatile ferroelectric capacitor includes a storage node SN, a ferroelectric layer FL inside the storage node SN, and a plate line PL inside the ferroelectric layer FL. The storage nodes SN of the nonvolatile ferroelectric capacitors in each set are separated from one another by the insulating film 8.

As FIG. 7 shows, within each trench in the insulating film 10, there are formed multiple, e.g., 8, nonvolatile ferroelectric capacitors. As a result, the area of each capacitor is reduced.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a nonvolatile ferroelectric memory device having a cell array block including a plurality of unit cells, the method comprising:

forming cell transistors on a semiconductor substrate;

forming contact nodes for connecting cell capacitors to the cell transistors;

forming a first insulating film over the cell transistors and the contact nodes;

selectively etching the first insulating film to form trenches, wherein each of the trenches exposes a plurality of contact nodes;

forming a plurality of storage nodes connected to the plurality of contact nodes on an inner surface of each of the trenches, wherein the storage nodes are separated from each other and the plurality of storage nodes that are separated from each other are formed on an inner surface of each of the trenches, each storage node formed to be L-shaped on an inner surface of each of the trenches;

forming a ferroelectric layer over the storage nodes; and forming a plate line over the ferroelectric layer.

2. The method according to claim 1, wherein the contact nodes are formed by a plug process.

3. The method according to claim 1, wherein the storage nodes are separated from each other by an insulating film.

4. The method according to claim 1, wherein the storage nodes are separated from each other by the ferroelectric layer.

5. The method according to claim 1, wherein the storage nodes are separated from each other by a damascene process.

6. The method according to claim 1, wherein the storage nodes are separated from each other by an etch-back process.

7. The method according to claim 1, wherein the storage nodes are separated from each other by a planarization process.

8. The method according to claim 1, wherein the plate line is formed by chemical vapor deposition or atomic layer deposition.

* * * * *

UNITED STATES PATENT AND TRADEMARK OFFICE
CERTIFICATE OF CORRECTION

PATENT NO. : 8,129,200 B2  
APPLICATION NO. : 12/905706  
DATED : March 6, 2012  
INVENTOR(S) : Hee Bok Kang Page 1 of 1

It is certified that error appears in the above-identified patent and that said Letters Patent is hereby corrected as shown below:

Title Page

Insert foreign application priority data as follows:

--[30]   Foreign Application Priority Data

Feb. 17, 2006 (KR) ............ 10-2006-0015662  
Feb. 17, 2006 (KR) ............ 10-2006-0015659--

Signed and Sealed this  
Twenty-ninth Day of May, 2012

David J. Kappos  
*Director of the United States Patent and Trademark Office*